United States Patent
Sugiyama

(10) Patent No.: US 7,129,136 B2
(45) Date of Patent: Oct. 31, 2006

(54) SEMICONDUCTOR MEMORY DEVICE AND MANUFACTURING METHOD THEREOF

(75) Inventor: Yoshihiro Sugiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 248 days.

(21) Appl. No.: 10/950,456

(22) Filed: Sep. 28, 2004

(65) Prior Publication Data

US 2005/0037574 A1 Feb. 17, 2005

Related U.S. Application Data

(62) Division of application No. 10/364,387, filed on Feb. 12, 2003, now Pat. No. 6,809,371.

(30) Foreign Application Priority Data

Mar. 27, 2002 (JP) ............................. 2002-087301

(51) Int. Cl.
*H01L 21/336* (2006.01)

(52) U.S. Cl. ...................... 438/261; 438/216; 438/287; 438/288; 438/591

(58) Field of Classification Search ................ 438/216, 438/261, 264, 287, 288, 591, 594
See application file for complete search history.

(56) References Cited

U.S. PATENT DOCUMENTS

| | | | |
|---|---|---|---|
| 5,292,673 A | 3/1994 | Shinriki et al. | |
| 5,874,761 A | 2/1999 | Nakao | |
| 5,998,264 A | 12/1999 | Wu | |
| 6,060,743 A | 5/2000 | Sugiyama et al. | |
| 6,208,000 B1 | 3/2001 | Tanamoto et al. | |
| 6,309,927 B1 | 10/2001 | Au et al. | |
| 6,607,952 B1 | 8/2003 | Yagishita et al. | |
| 6,737,716 B1 * | 5/2004 | Matsuo et al. ............... | 257/406 |
| 2002/0185674 A1 | 12/2002 | Kawashima et al. | |
| 2003/0021079 A1 * | 1/2003 | Natori et al. ............... | 361/302 |
| 2003/0092238 A1 | 5/2003 | Eriguchi | |
| 2003/0173586 A1 | 9/2003 | Moriwaki et al. | |
| 2003/0183859 A1 | 10/2003 | Gnafinger | |
| 2003/0206445 A1 | 11/2003 | Forbes | |

FOREIGN PATENT DOCUMENTS

| | | | |
|---|---|---|---|
| JP | 11186421 A | | 7/1999 |
| JP | 2002110999 A | | 4/2002 |
| JP | 2004119649 | * | 4/2004 |

OTHER PUBLICATIONS

Patent Abstracts of Japan, Publication No. 07-221208, dated Aug. 18, 1995.

(Continued)

*Primary Examiner*—Mary Wilczewski
*Assistant Examiner*—Toniae M. Thomas
(74) *Attorney, Agent, or Firm*—Westerman, Hattori, Daniels & Adrian, LLP.

(57) ABSTRACT

A semiconductor memory device which more reliably retains electrons trapped in its charge-trapping regions. A high-dielectric gate insulating film is grown on a semiconductor substrate. This gate insulating film is composed of first and second oxides, where the second oxide has a smaller bandgap than that of the first oxide and is scattered in dot-like form, surrounded by the first oxide. The memory cell is programmed by injecting electrons into a local potential minimum that is produced due to the bandgap difference between the phase-separated first and second oxides.

7 Claims, 12 Drawing Sheets

OTHER PUBLICATIONS

Patent Abstracts of Japan, Publication No. 08-008350, dated Jan. 12, 1996.
Patent Abstracts of Japan, Publication No. 10-262873, dated Oct. 6, 1998.
Patent Abstracts of Japan, Publication No. 11-003981, dated Jan. 6, 1999.
Patent Abstracts of Japan, Publication No. 2000-009181, dated Jan. 11, 2000.

* cited by examiner

SEMICONDUCTOR MEMORY DEVICE AND MANUFACTURING METHOD THEREOF

CROSS-REFERENCE TO RELATED APPLICATIONS

This application is based upon and claims priority of Japanese Patent Application No. 2002-87301, filed on Mar. 27, 2002, the contents being incorporated herein by reference. This is a Divisional of application Ser. No. 10/364,387 Filed Feb. 12, 2003 now U.S. Pat. No. 6,809,371.

BACKGROUND OF THE INVENTION

1. Field of the Invention

The present invention relates to a semiconductor memory device, and more particularly to a non-volatile semiconductor memory device with a high-dielectric gate insulating film.

2. Description of the Related Art

Metal-oxide-semiconductor field-effect transistors (MOSFETs) are widely used in integrated circuits, particularly including memory devices for storing digital data, such as electrically erasable programmable read-only memory (EEPROM) and flash memory. Cellular phones, for example, employ this kind of semiconductor memory chips as their firmware code storage, and personal computers have one on their motherboard to store the basic input/output system (BIOS) program. For EEPROM, there are several different architectures each having distinct characteristics and features. Among them are floating-gate metal-nitride-oxide semiconductor (MNOS) structure and metal-oxide-nitride-oxide semiconductor (MONOS) structure.

FIG. 12 shows a simplified cross-sectional view of a MONOS cell, as an example of an existing non-volatile memory device. This MONOS-type semiconductor memory cell 50 is formed on top of a p-type silicon (Si) substrate 51 having a source region 51s and a drain region 51d which are created as heavily n-doped wells. Covering the channel region between the source and drain, an oxide-nitride-oxide (ONO) stack 52 is grown on the substrate surface, which consists of a silicon oxide ($SiO_2$) film 52a, a silicon nitride (SiN) film 52b, and another $SiO_2$ film 52c. Deposited on top of that is a control gate 53. In short, the MONOS cell is an n-channel MOSFET whose gate insulation layer is replaced with the ONO stack 52.

The illustrated MONOS cell 50 serves as a one-bit memory which can be programmed by injecting electrons from the silicon substrate 51 into traps that exist in the vicinity of the interface between the $SiO_2$ film 52a and SiN film 52b or inside the SiN film 52b itself. The trapped charge causes a change in the threshold level of that MOSFET, meaning that we can control its on/off state by charging or not charging the cell 50.

In relation to the above, a non-volatile semiconductor memory device called NROM is of particular interest recently. NROM, which stands for "nitrided read-only memory," was developed by Saifun Semiconductors Ltd. in Israel. While based on the MONOS concept described above, NROM realizes a multibit cell structure by using charge-retaining traps at two separate sites (one is near the source, and the other is near the drain), thereby storing two bits per cell. This NROM technology is expected to provide a way to larger capacity, high density non-volatile memory devices.

The above-described MONOS memories, however, has the following problem in its ONO structure. That is, the SiN film used in this structure is known to have (as its inherent nature) not a small amount of fixed charges and traps in itself. Injection of electrons into a charge-retaining region of a MONOS cell requires a relatively high voltage of a few volts or around ten volts, so as to make Fowler-Nordheim (FN) tunneling or direct tunneling happen. In this tunneling process, some exited electrons behave as hot carriers which would produce new traps in an ONO film, or would sweep away some trapped charges toward the gate electrode.

The aforementioned NROM devices use near-source region and near-drain regions of a silicon nitride film to trap electrons. It is, however, difficult to obtain well-controlled traps having an intended depth, capture cross-section, capture rate, and emission rate. Also, electrons trapped in one region would raise the potential energy, and some of them could escape and move to the other trapping region, resulting in a memory data error.

SUMMARY OF THE INVENTION

In view of the foregoing, it is an object of the present invention to provide a semiconductor memory device which more reliably retains electrons trapped in its charge-trapping regions.

Another object of the present invention is to provide a method of manufacturing a semiconductor memory device which more reliably retains electrons trapped in its charge-trapping regions.

To accomplish the first object stated above, according to the present invention, there is provided a non-volatile semiconductor memory device. This device comprises the following elements: a semiconductor substrate; a high-dielectric gate insulating film grown on the semiconductor substrate, which comprises a first oxide and a second oxide, the second oxide having a smaller bandgap than that of the first oxide and being scattered in dot-like form in the first oxide; and a control gate electrode deposited on the high-dielectric gate insulating film.

Further, to accomplish the second object stated above, the present invention provides a method of manufacturing a non-volatile semiconductor memory device which uses a high-dielectric material for gate insulation. This method comprises the following steps: forming a gate insulating film by depositing a mixture of a first oxide and a second oxide having a smaller bandgap than that of the first oxide; and applying a heat treatment to the gate insulating film to create a phase separated state of the first and second oxides deposited.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
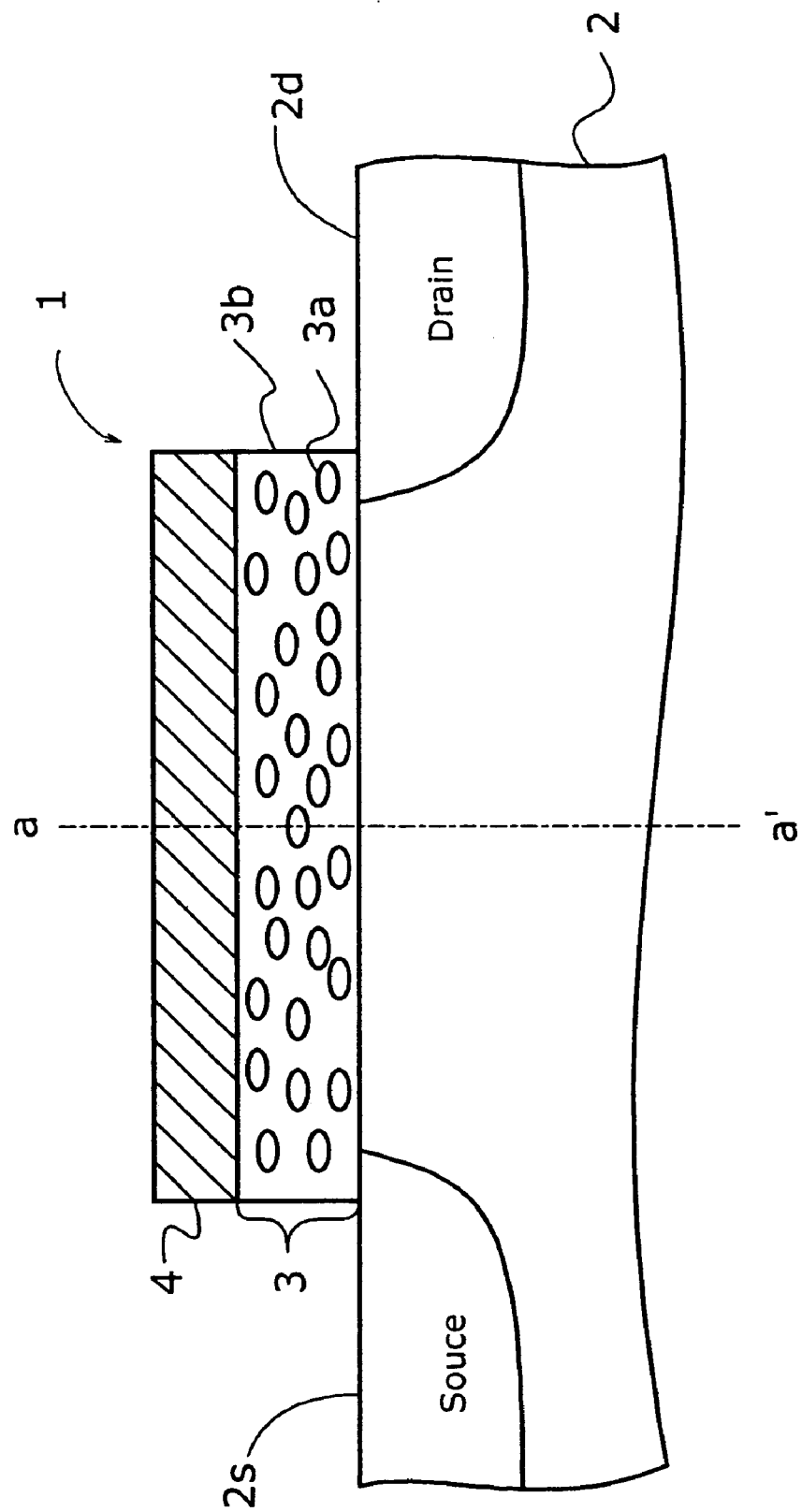
FIG. 1 is a simplified cross-sectional view of a semiconductor memory cell according to a first embodiment of the present invention.

Preferred embodiments of the present invention will be described below with reference to the accompanying drawings, wherein like reference numerals refer to like elements throughout.

FIG. 1 is a simplified cross-sectional view of a semiconductor memory cell according to a first embodiment of the present invention. While a semiconductor memory device actually contains a number of memory cells, FIG. 1 shows only one such memory cell for the purpose of explanation. The illustrated semiconductor memory cell 1 is constructed on a p-type semiconductor substrate 2. A source region 2s and a drain region 2d are formed in a surface region of the semiconductor substrate 2. Then a high-dielectric gate insulating film 3 is formed on top of the semiconductor substrate 2, covering the channel region between the source region 2s and drain region 2d. Deposited on top of the high-dielectric gate insulating film 3 is a control gate 4.

Here, the semiconductor substrate 2 is a silicon substrate, and its source region 2s and drain region 2d are n+ regions created by ion-implanting a substance such as phosphorus (P). The control gate 4 is made of polysilicon, for example. The next paragraphs will describe the concept and formation of the high-dielectric gate insulating film 3.

Professor A. I. Kingon et al. in North Carolina State University discussed phase separation of oxide materials, using specific phase diagrams, in the conference of "International Workshop on Gate Insulator (IWGI) 2001" held in Tokyo, Nov. 1–2, 2001. They reported that a group of oxides expressed by a molecular formula of $MO_2$ (where M represents silicon (Si), titanium (Ti), hafnium (Hf), zirconium (Zr), or the like) have a tendency of causing phase separation. They further indicated a tendency to form silicates, of another group of oxides expressed by a molecular formula of $M'_2O_3$, where M' represents aluminum (Al), yttrium (Y), lanthanum (La), praseodymium (Pr), gadolinium (Gd), dysprosium (Dy), or the like. In view of their report, it is expected that a mixture of several $MO_2$-type oxides, or a mixture of $MO_2$-type oxide and $M_2O_3$-type oxides, would exhibit phase separation. Phase separation of two or more kinds of substances occurs because of the difference in their formation energies in the thermal equilibrium state. In phase-separated state, one substance is usually observed as "dot"-like microscopic clusters scattered in the other substance. The substance in each "dot" will make a local potential minimum if that substance has a lower energy potential than the surrounding material.

According to the present invention, the proposed memory cell 1 uses a mixture of several $MO_2$-type oxides, or of $MO_2$-type oxides and $M_2O_3$-type oxides discussed above to form a high-dielectric gate insulating film 3. More specifically, think of a mixture of two kinds of oxides 3a and 3b. Through an appropriate heat treatment, the mixture of two different oxides is phase-separated, and the gate insulating film 3 gains a non-uniform structure consisting of dot-like regions of one oxide 3a and their surrounding regions of the other oxide 3b. If we can choose appropriate materials for such dot-like oxide 3a and surrounding oxide 3b, and if the former oxide 3a has a lower energy potential than the latter oxide 3b, the combination of those two oxides will enable us to produce an electron-trapping local potential minimum and use it as a device for retaining information.

The present embodiment uses hafnium (Hf) silicate, a mixture of $HfO_2$ and $SiO_2$, for use as the high-dielectric gate insulating film 3. This material produces a phase-separated structure of hafnium-rich dot-like oxide 3a and silicon-rich surrounding oxide 3b.

Figure 2:
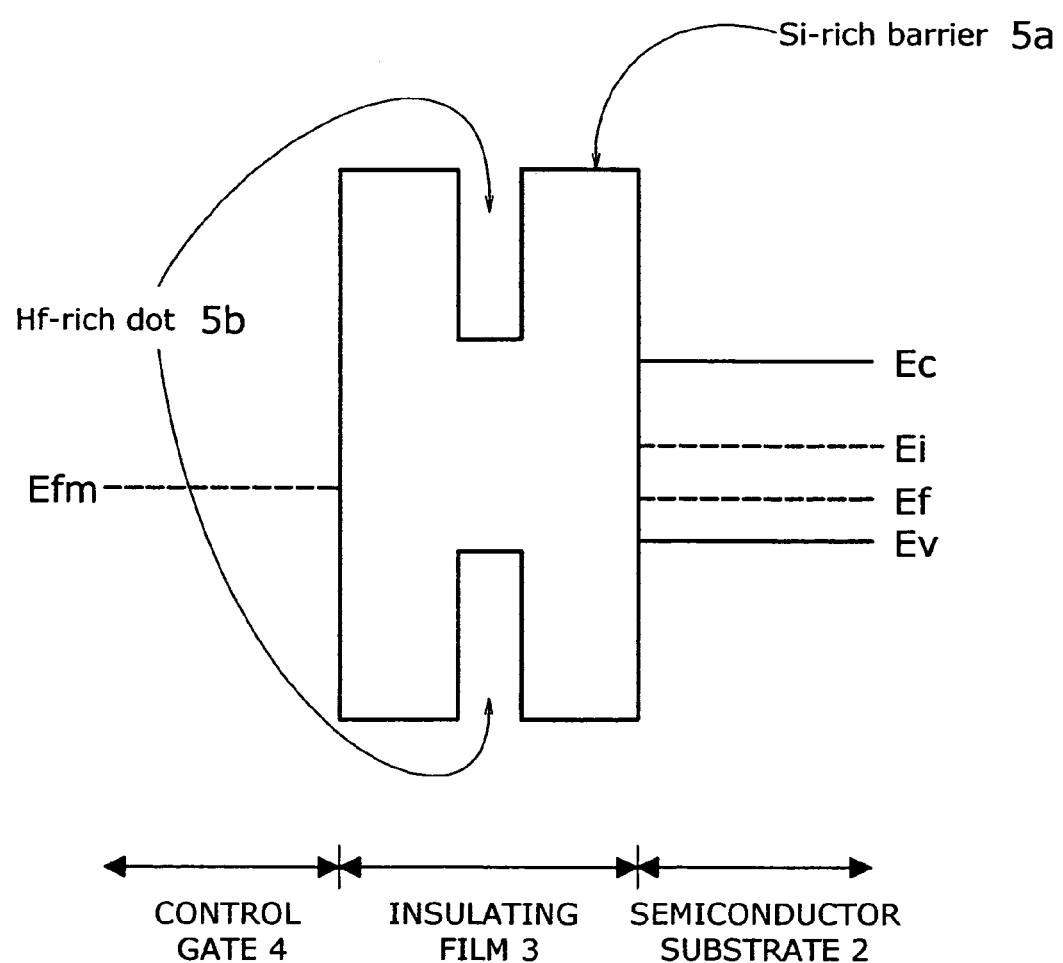
FIG. 2 is an energy band diagram at cross-section a–a' of the semiconductor memory cell shown in FIG. 1.

FIG. 2 is an energy band diagram at cross section a–a' of the proposed memory cell of FIG. 1. This diagram is divided into the following three sections along the a–a' cross section: the left section representing the energy band of the control gate 4, the central section representing that of the high-dielectric gate insulating film 3, and the right section representing that of the semiconductor substrate 2. It is assumed here that the Fermi level Ef of the semiconductor substrate 2 agrees with the Fermi level Efm of the control gate 4 (i.e., a flat-band condition is established). The intrinsic Fermi level Ei of silicon lies in the middle of the bandgap (i.e., midway between the bottom conduction-band level Ec and the top valence-band level Ev). Since the semiconductor substrate 2 is made of p-type silicon, its Fermi level Ef is located below the intrinsic Fermi level Ei.

The high-dielectric gate insulating film 3, on the other hand, has a more complex bandgap structure because it contains two different materials: $SiO_2$ with a bandgap of about 9 electron volts (eV) and $HfO_2$ with a bandgap of about 5 eV. Because of this difference between $SiO_2$ and $HfO_2$, the silicon-rich phase and hafnium-rich phase in the gate insulating film 3 exhibit a bandgap difference of about 4 eV. Assuming that each half of this 4 eV contributes to discontinuity of energy band levels, the two phase-separated regions in the gate insulating film 3 will produce a local potential minimum with a barrier height of nearly 2 eV. FIG. 2 shows this potential pocket as a hafnium-rich dot 5b surrounded by silicon-rich barrier 5a in the energy band structure of the high-dielectric gate insulating film 3.

Figure 3A:
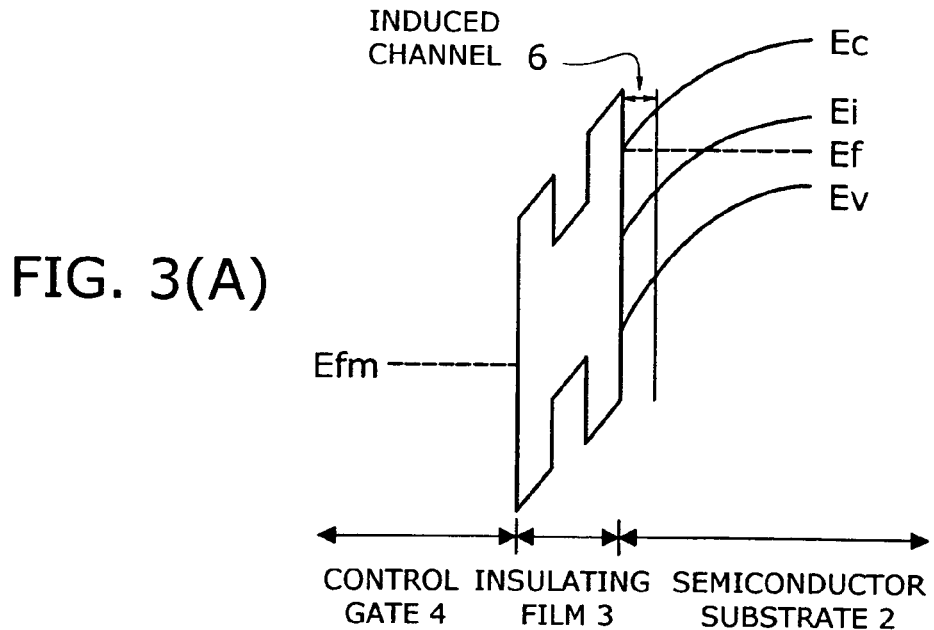
FIGS. 3(A) to 3(C) show the principle of storage operation of the proposed semiconductor memory cell, including: an energy band diagram at cross section a–a' of a cell with no electrons charged (FIG. 3(A)), an energy band diagram of a cell with electrons charged (FIG. 3(B)), and the resulting curve of drain current versus gate voltage (FIG. 3(C))
Figure 3B:
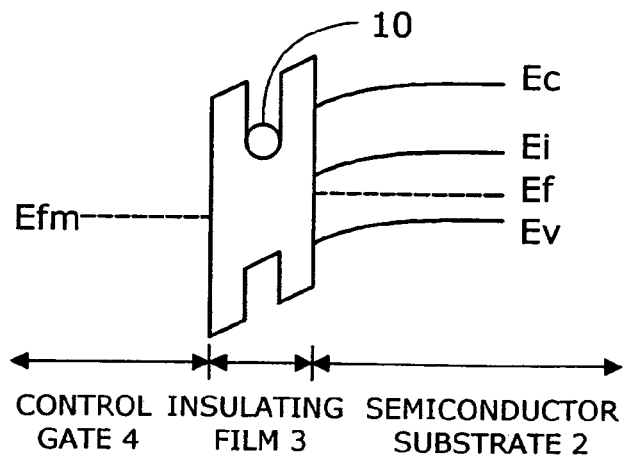
Figure 3C:
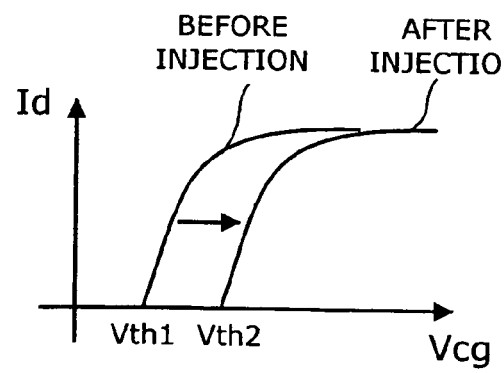

Electrons injected into the high-dielectric gate insulating film 3 will be captured and trapped in the above-described local potential minimum, which permits the semiconductor memory cell 1 to serve as a memory. Referring next to FIG. 3(A) to 3(C), the following section will explain how the proposed semiconductor memory cell 1 operates as a storage device.

FIGS. 3(A) to 3(C) show the principle of storage operation of the proposed semiconductor memory cell 1. More specifically, FIG. 3(A) shows the energy band at the cross section a–a' with no electrons injected. FIG. 3(B) shows the same after injection. FIG. 3(C) shows a resulting change in the characteristic of drain current versus gate voltage. With no trapped electrons in the local potential minimum, the Fermi level Ef comes close to the bottom energy level Ec of conduction band when a positive voltage Vcg is applied to the control gate 4. This means that a certain amount of n-type region (channel) 6 is induced near the surface of the semiconductor substrate 2 as shown in FIG. 3(A), permitting a drain current Id to flow to the source.

When, on the other hand, there are electrons 10 in the local potential minimum, the resulting coulomb repulsion raises the potential as shown in FIG. 3(B), and consequently, the threshold level of the MOSFET increases from Vth1 to Vth2, as shown in FIG. 3(C). Unlike the case without charges in the local potential minimum, now the MOSFET does not allow a drain current Id to flow unless a higher gate voltage Vcg is given. To store "1" in the semiconductor memory cell 1, the local potential minimum is filled with electrons 10. To store "0," it is emptied. In this way, the semiconductor memory cell 1 functions as a one-bit storage device.

The local potential minimum can be charged with electrons 10 through the following methods: substrate injection, channel hot electron injection, Fowler-Nordheim (FN) tunneling, and direct tunneling. Brief description of each method is provided below.

The substrate injection method applies a voltage between the semiconductor substrate 2 and the channel 6 induced by a gate voltage Vcg, so that the resulting electric field in a depletion region (not shown) will accelerate electrons 10 therein and send them into the local potential minimum. In the channel hot electron injection, the drain is driven with a positive voltage Vd that is equal to or higher than its gate voltage Vcg. This produces hot electrons in the vicinity of the drain for injection to the local potential minimum. The FN tunneling, on the other hand, injects electrons 10 into the local potential minimum using a tunneling current through a sufficiently thin insulating film where a triangular potential barrier is present due to a high gate voltage Vcg being applied. The direct tunneling causes a tunneling current to flow across a trapezoidal potential barrier in a sufficiently thin insulating film, thereby injecting electrons 10 directly into the local potential minimum.

Figure 4:
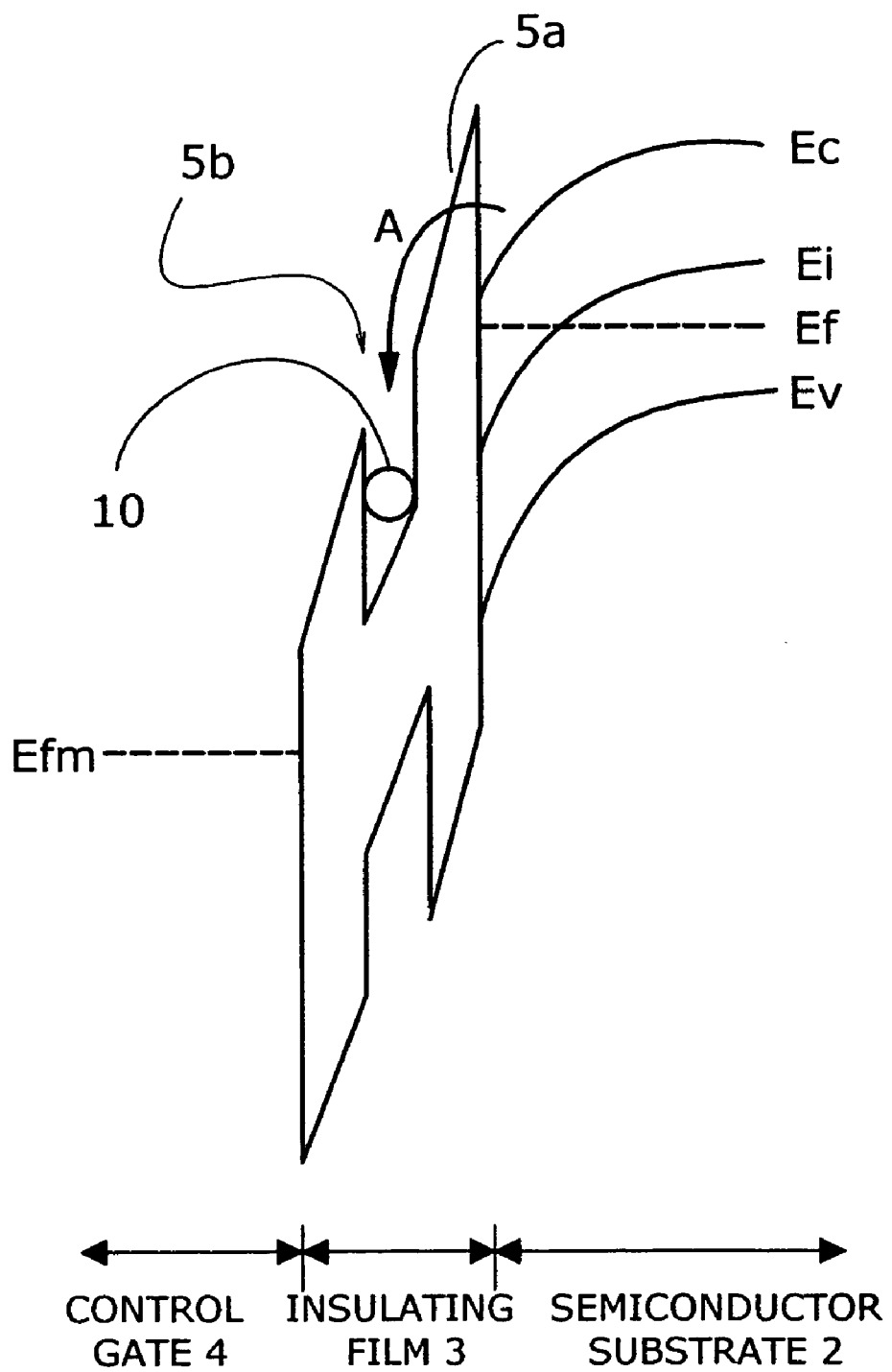
FIG. 4 is an energy band diagram of the proposed memory cell, showing how FN tunneling is performed.

FIG. 4 is an energy band diagram at cross section a–a' of the proposed semiconductor memory cell of FIG. 1, showing how FN tunneling is performed. With a high positive gate voltage Vcg, the energy band in the high-dielectric gate insulating film 3 is deformed severely, which results in a situation where the film thickness is virtually reduced. This makes it likely that electrons 10 can tunnel through the silicon-rich barrier 5a and reach the local potential minimum at the hafnium-rich dot 5b, as indicated by arrow A in FIG. 4.

As can be seen from the above explanation, the present embodiment takes advantage of a phase-separated, uneven material structure in constructing a high-dielectric gate insulating film 3, where electrons are localized in a local potential minimum produced by hafnium-rich dot-like oxide 3a. Once trapped, the electrons hardly escape from the pocket because of its high potential barrier, causing a shift in the threshold voltage of the MOSFET. This state is stably retained until the charge is extracted from the pocket with an erasing electric field, meaning that the device can function as a non-volatile memory.

An appropriate selection of the substances for the high-dielectric gate insulating film 3 enables us to control the properties of traps, including their trap depth, capture cross-section, capture rate, and emission rate. Conventional memory devices with SiN layer may encounter accidental generation of traps and variations in the properties of traps because electrons captured by dangling bonds change the condition of trapped charges. The device in the present embodiment, however, can keep an injected charge for a long time in a stable way because of its phase-separated structure of insulating materials where dot-like local potential minimum is formed. In this gate insulating film structure, the captured electrons do not interact with surrounding bonds, while causing a variation in the potential energy.

Figure 5:
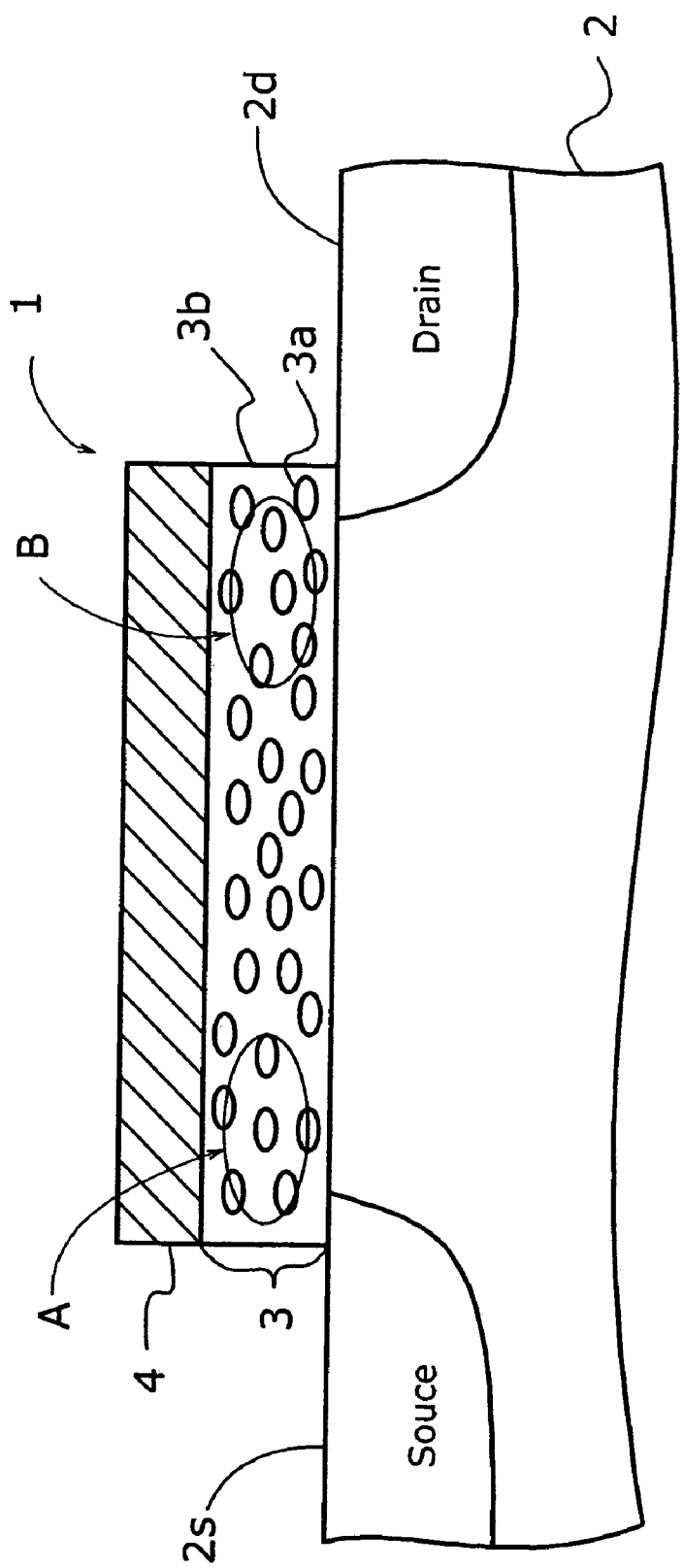
FIG. 5 is a cross-sectional view of a semiconductor memory cell with two charge-trapping regions according to the first embodiment of the invention.

The memory design of the first embodiment can also be used to realize a two-bit-per-cell storage function, as in the NROM architecture discussed earlier in the Related Art section of this specification. FIG. 5 is a cross-sectional view of a semiconductor memory cell. As indicated by the circles A and B, this memory cell has two charge-trapping regions in its high-dielectric gate insulating film 3, one being near the source region 2s and the other being near the drain region 2d. The aforementioned injection techniques (e.g., FN tunneling and direct tunneling) can be used to populate those two separate regions with electrons individually. The presence and absence of such localized charge in regions A and B represent two-bit binary values "00," "01," "10," and "11."

The semiconductor memory cell 1 controls its two charge-trapping regions in the following way. In the case FN tunneling is used, the near-source region A in the high-dielectric gate insulating film 3 can be charged by applying a sufficiently high gate voltage Vcg with respect to the source potential Vs. Under this condition of Vcg>>Vs, the resulting tunneling current populates the local potential minimum in region A with electrons. The near-drain region B, on the other hand, can be charged by applying a sufficiently high gate voltage Vcg with respect to the drain potential Vd. With Vcg>>Vd, the resulting tunneling current fills the local potential minimum in region B with electrons.

Figure 6:
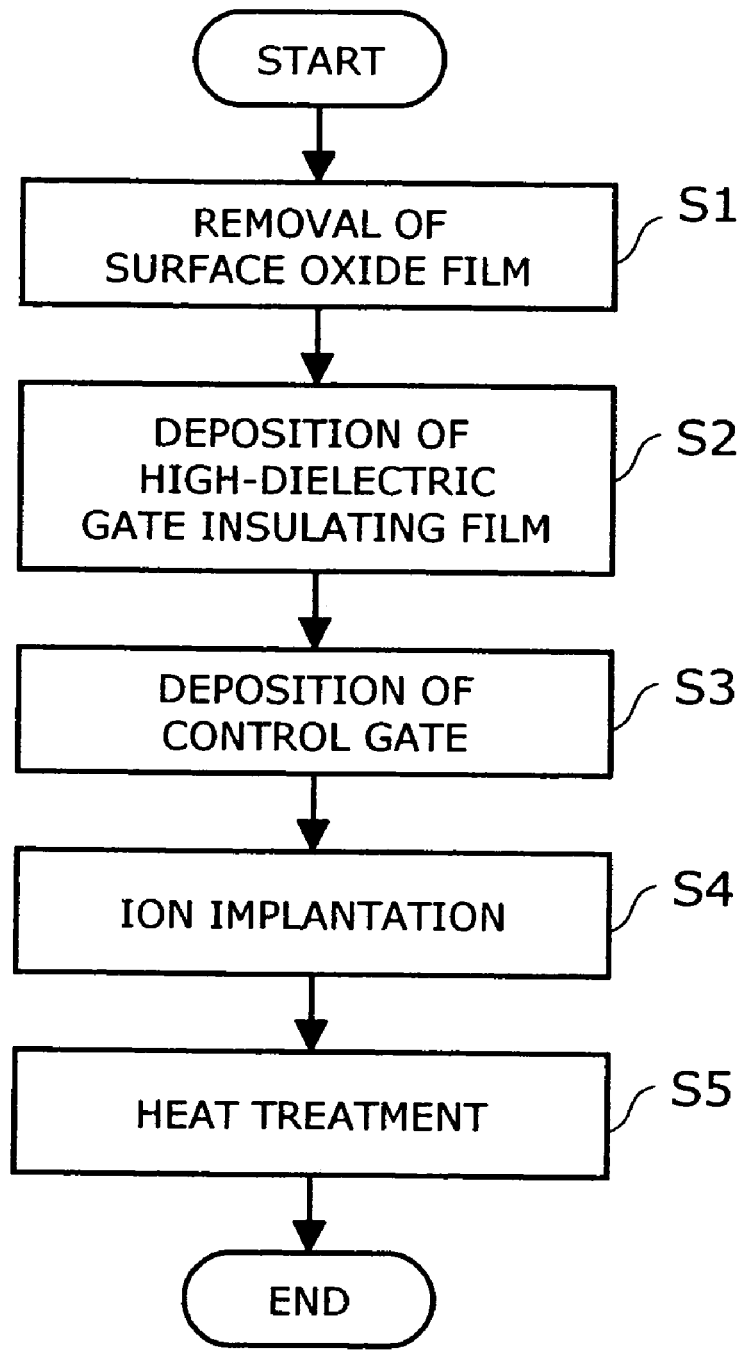
FIG. 6 is a flowchart which shows a method of manufacturing semiconductor memory devices according to the present invention.

Referring next to FIG. 6, a manufacturing method for the proposed semiconductor memory cell 1 will be described below, assuming the use of Hf silicate composed of $HfO_2$ and $SiO_2$ to form a high-dielectric gate insulating film 3. FIG. 6 is a flowchart which shows a method of manufacturing semiconductor memory devices according to the first embodiment. This process includes the following steps:

S1: Removal of Surface Oxide Film

This step removes a silicon oxide film from the surface of the semiconductor substrate 2. Another step has been executed before this step S1 to form a field oxide layer for isolating active areas of the semiconductor substrate 2, so that a plurality of memory cells can be produced on the same substrate.

S2: Deposition of High-Dielectric Gate Insulating Film

This step uses a metal-organic chemical vapor deposition (MOCVD) process to grow a high-dielectric gate insulating film 3 of Hf silicate composed of $HfO_2$ and $SiO_2$. In this MOCVD process, the following source materials are used as reactants: tetrakis(diethylamino)hafnium (TDEAHf) for hafnium (Hf); bis(tertiary-butylamino)silane (BT-BAS) for silicon (Si), oxygen gas ($O_2$) or nitrous oxide ($N_2O$) for oxygen (O). Nitrogen gas ($N_2$) is also used as the carrier gas. With the growth pressure adjusted to 60 torr, an 8-nm insulating film is grown at a substrate temperature of 500 degrees Celsius.

S3: Deposition of Control Gate

Using an appropriate photoresist pattern as a mask, polysilicon is deposited at a temperature of 650 degrees Celsius, on top of the high-dielectric gate insulating film 3 formed in step S2. The resulting polysilicon film is used as the control gate 4.

S4: Ion Implantation

After removal of the photoresist, phosphorus is ion-implanted into the source region 2s, drain region 2d, and control gate 4.

S5: Heat Treatment

The ion implantation is followed by a rapid thermal anneal (RTA) with a duration of ten seconds at 1000 degrees Celsius. Besides activating the dopant in the substrate 2, this RTA process brings the high-dielectric gate insulating film 3 into a phase-separated state where hafnium-rich dot-like oxide 3a is scattered in silicon-rich oxide 3b.

Fabricated through the above steps are semiconductor memory cells 1 each having the structure of FIG. 1. To evaluate some experimental chips, the inventor conducted a composition analysis with energy dispersive X-ray spectroscopy (EDXS), together with transmission electron microscopy (TEM). In this analysis, a phase-separated state was observed in the produced gate insulating film, in which small dot-like hafnium-rich regions are surrounded by silicon-rich regions. The analysis further revealed that the dot-like regions are about 5 nm in size and contain more than 90 percent of hafnium, while the surrounding regions contain more than 90 percent of silicon.

The above steps S1 to S5 are followed by a process of forming electrodes for wiring the semiconductor memory cells 1.

S6: Formation of Electrodes

After step S5, the wafer is processed by chemical vapor deposition (CVD) to deposit an interlayer isolation film (not shown) on top of it. The subsequent photolithography and etching process removes the isolation film at selected portions of the source region 2s, drain region 2d, control gate 4, thus creating openings for electrodes. Subsequently, a conductive material is deposited by using a sputtering method, and this layer is then selectively etched through a patterning process, which produces a source electrode, drain electrode, and gate electrode (not shown) on each semiconductor memory cell 1.

It should be noted here that no special process is necessary to produce a phase-separated state of hafnium-rich and silicon-rich regions in a high-dielectric gate insulating film 3. Rather, the aforementioned heat treatment is commonly seen in ordinary manufacturing processes of semiconductor devices. While the step S5 uses RTA after ion implantation to cause phase separation, it is not intended to limit the invention to that method. Alternatively, an annealing process may be executed after forming the high-dielectric gate insulating film 3. It should be noted here that a heat treatment process may produce silicide in the interface between the high-dielectric gate insulating film 3 and polysilicon control gate, which must be avoided since it could cause an unwanted leak current. One way to prevent this silicide formation is oxynitridation of the surface of the high-dielectric gate insulating film 3.

Figure 7:
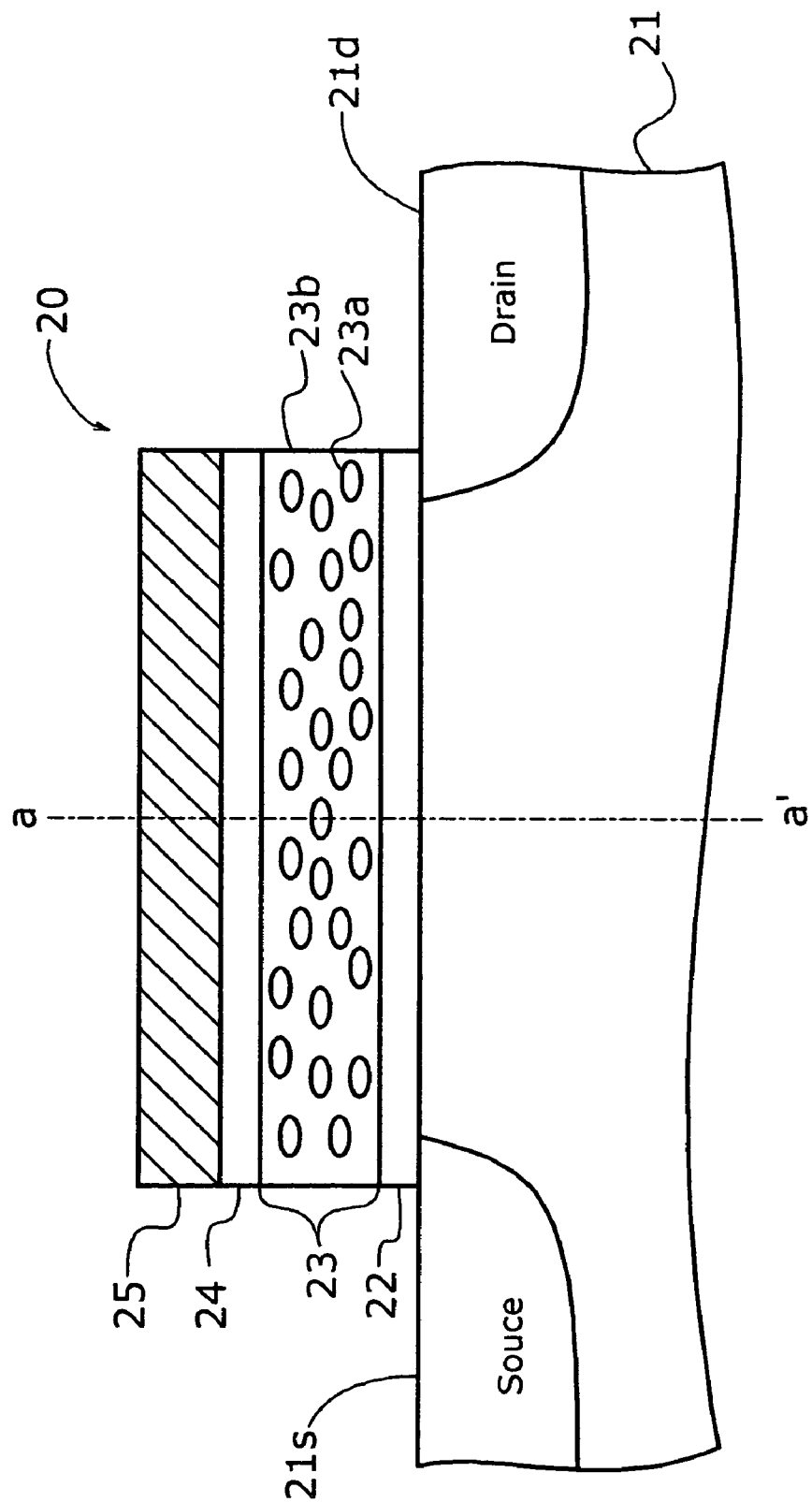
FIG. 7 is a simplified cross-sectional view of a semiconductor memory cell according to a second embodiment of the present invention.
Figure 8:
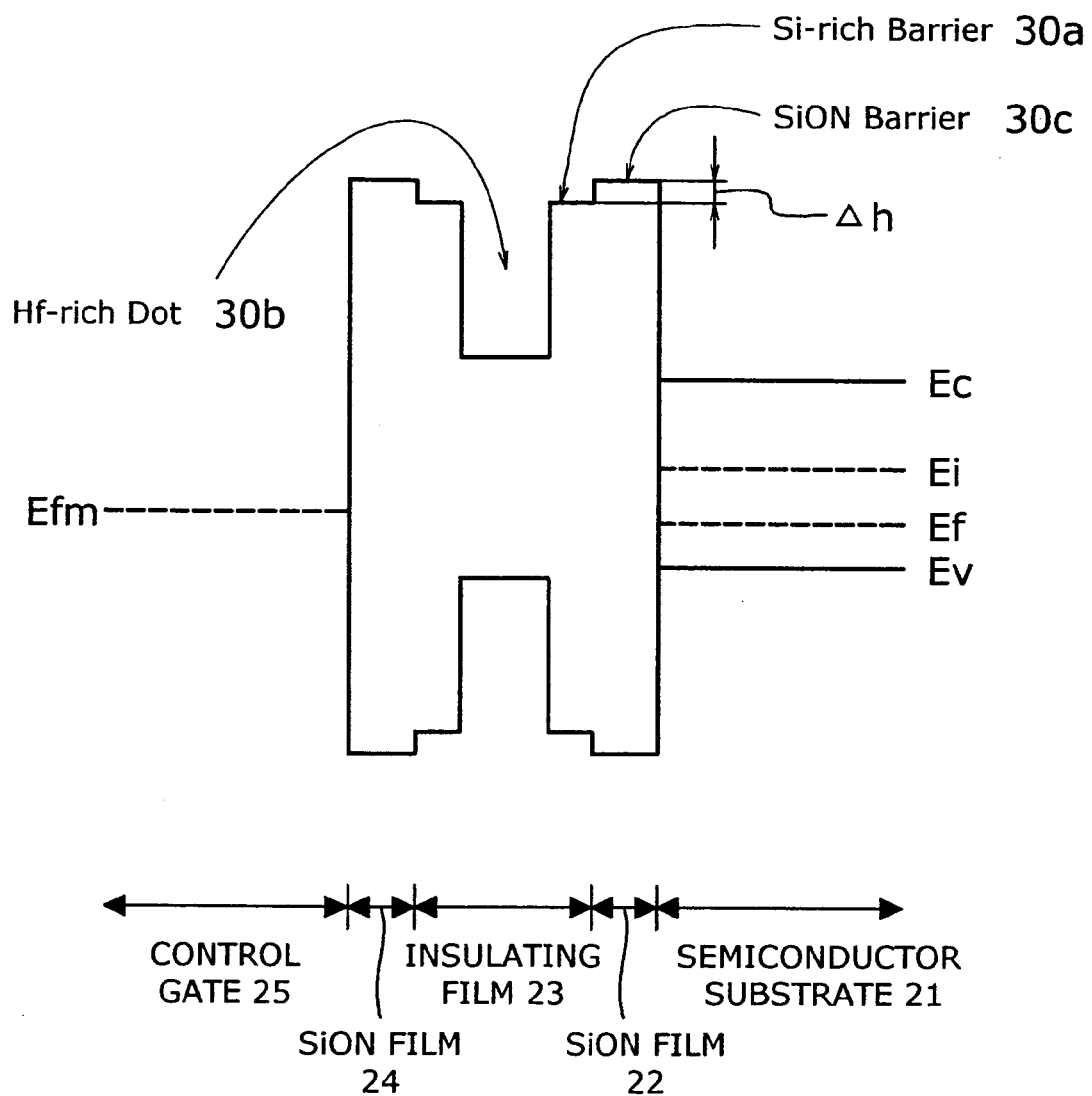
FIG. 8 is an energy band diagram at cross section a–a' of the proposed memory cell shown in FIG. 7.
Figure 9:
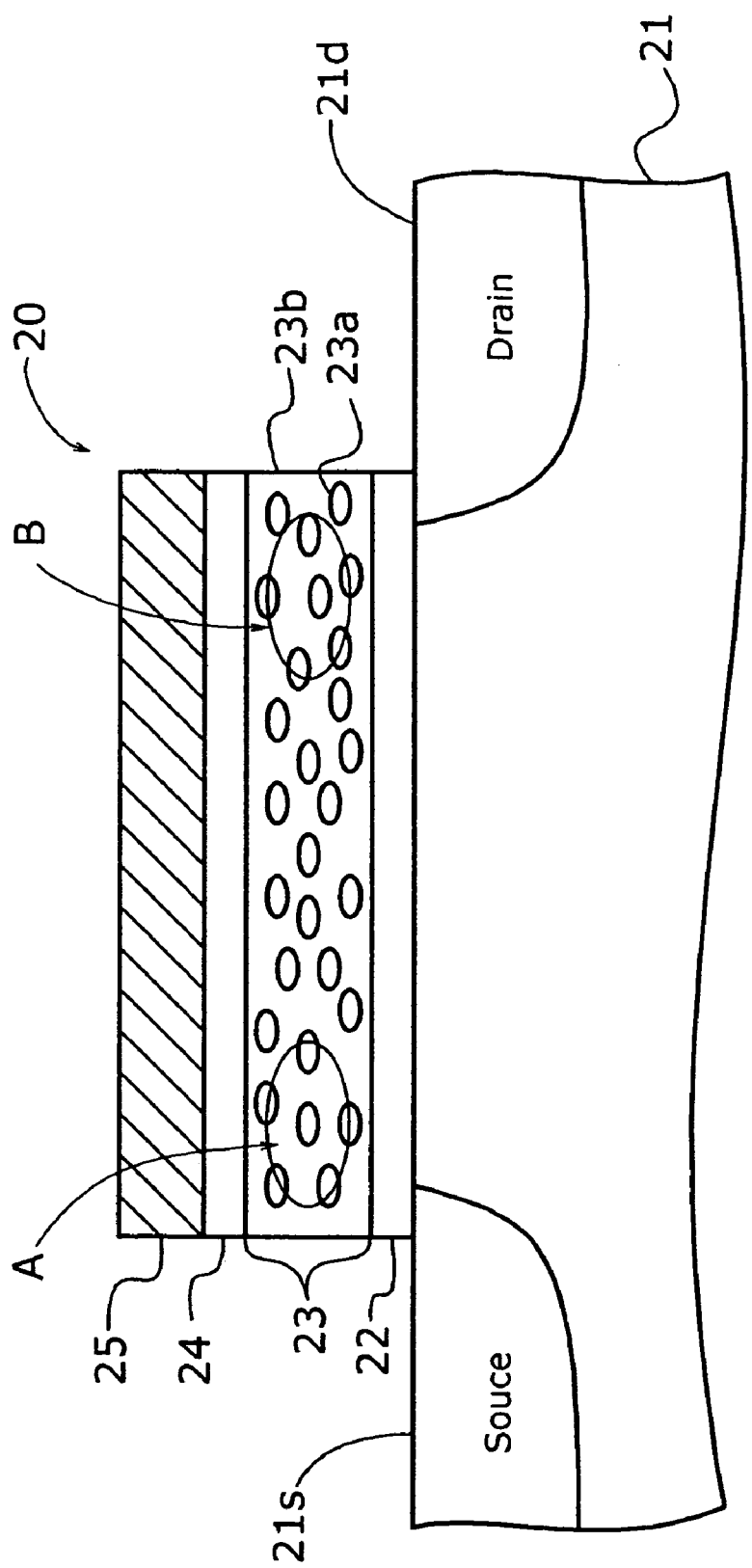
FIG. 9 is a cross-sectional view of a semiconductor memory cell with two charge retaining regions according to the second embodiment of the invention.

Referring next to FIGS. 7 to 9, another embodiment of the present invention will be described. FIG. 7 is a simplified cross-sectional view of a semiconductor memory cell 20 according to a second embodiment. This memory cell 20 is formed on a p-type semiconductor substrate 21. A source region 21s and drain region 21d are formed in a surface region of the semiconductor substrate 21. Covering the channel region between the source region 21s and drain region 21d, a silicon oxynitride (SiON) film 22, a high-dielectric gate insulating film 23, and another SiON film 24 are stacked in this order. Deposited on top of the SiON film 24 is a control gate 25. As can be seen from this diagram, the second embodiment differs from the first embodiment in that its high-dielectric gate insulating film 23 is sandwiched by two SiON films 22 and 24.

Here, the semiconductor substrate 21 is a p-type silicon substrate, and its source region 21s and drain region 21d are n+ regions created by ion-implanting an impurity such as phosphorus (P). The control gate 25 is made of polysilicon, for example. As in the first embodiment, the high-dielectric gate insulating film 23 is made of Hf silicate, a mixture of $HfO_2$ and $SiO_2$, which forms a phase-separated structure of hafnium-rich dot-like oxide 23a and silicon-rich surrounding oxide 23b.

The SiON films 22 and 24 contain up to about 10 percent of nitrogen (N) in $SiO_2$. Their thickness is 8 to 10 nm, as in the tunnel oxide films used in conventional flash memories, or may be smaller than that. The process for those SiON films 22 and 24 starts with growing a 5-nm $SiO_2$ film by dry oxidation at 900 degrees Celsius in $O_2$ atmosphere. The wafer is then annealed in an NO (or $N_2O$) gas atmosphere at 800 degrees Celsius, or subjected to a remote plasma nitridation (RPN) process.

FIG. 8 is an energy band diagram at cross section a–a' of the proposed memory cell shown in FIG. 7. This diagram is roughly divided into the following three sections along the a–a' cross section: the left section representing the energy band of the control gate 25, the central section representing that of the high-dielectric gate insulating film 23 and SiON films 22 and 24, and the right section representing that of the semiconductor substrate 21. The Fermi level Ef of the semiconductor substrate 21 is assumed to be equal to the Fermi level Efm of the control gate 25 (i.e., a flat-band condition is established). The intrinsic Fermi level Ei of silicon lies midway between the bottom conduction-band level Ec and the top valence-band level Ev. Since the semiconductor substrate 2 is made of p-type silicon, its Fermi level Ef is located below the intrinsic Fermi level Ei.

As in the first embodiment described earlier in FIG. 5, there is a hafnium-rich dot 30b surrounded by a silicon-rich barrier 30a. The second embodiment, however, provides a barrier that is enhanced by the presence of two SiON films 22 and 24a which add a SiON barrier 30c on both sides. More specifically, the SiON barrier 30c is Δh higher than the silicon-rich barrier 30a, which is produced by $SiO_2$ contained in the high-dielectric gate insulating film 23. The magnitude of Δh is about 0.1 eV. This difference Δh comes from the fact that the silicon-rich oxide region 23b contains a small amount of Hf, which makes its bandgap smaller than that of $SiO_2$. With the energy band structure of FIG. 8 the semiconductor memory cell 20 of the second embodiment has an enhanced data retention capability, compared to the first embodiment.

The proposed memory design of the second embodiment can be configured to store two bits per cell, just as in the first embodiment. FIG. 9 is a cross-sectional view of a semiconductor memory cell that stores electrons in two regions. As indicated by the circles A and B, this memory cell has two charge-trapping regions in its high-dielectric gate insulating film 23, one being near the source region 21s and the other being near the drain region 21d. The aforementioned injection techniques (e.g., FN tunneling and direct tunneling) can be used to charge those two regions with electrons. The presence and absence of such localized charge in two regions represent two-bit binary values "00," "01," "10," and "11."

The above description of two embodiments of the invention has assumed the use of Hf silicate as a material for high-dielectric gate insulating films. It is, however, not intended to limit the invention to this specific material. Rather, the present invention can be implemented with various combinations of $MO_2$-type oxide and $M'O_2$-type oxide, or $MO_2$-type oxide and $M'_2O_3$-type oxide, which are likely to produce a phase-separated structure as described earlier. The following list shows some, but not all, of the possible combinations of materials.

$ZrO_2$ and $SiO_2$
$HfO_2$ and $Al_2O_3$
$ZrO_2$ and $Al_2O_3$
$HfO_2$ and $La_2O_3$
$ZrO_2$ and $La_2O_3$
$HfO_2$ and $Y_2O_3$
$ZrO_2$ and $Y_2O_3$
$HfO_2$ and $Gd_2O_3$
$HfO_2$ and $Pr_2O_3$
$HfO_2$ and $Dy_2O_3$
$ZrO_2$ and $Dy_2O_3$ Further, any combinations of the above-listed compositions can be used for the high-dielectric gate insulating film.

While MOCVD is used to form high-dielectric gate insulating films 3 and 23 in the firs and second embodiments, it is not intended to limit the invention to that specific fabrication method. They can also be grown by using physical vapor deposition (PVD) processes such as sputtering.

Figure 10:
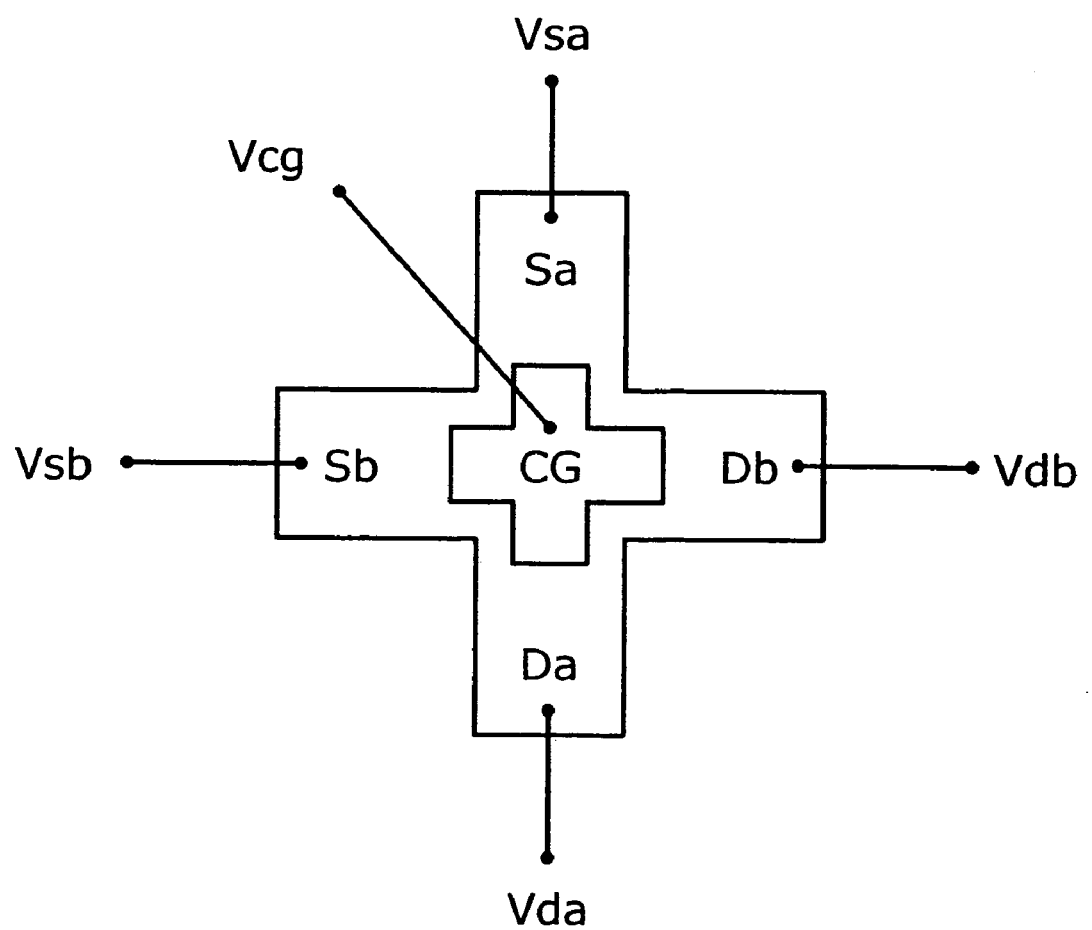
FIG. 10 is a plan view of a cross-shaped memory cell.
Figure 11:
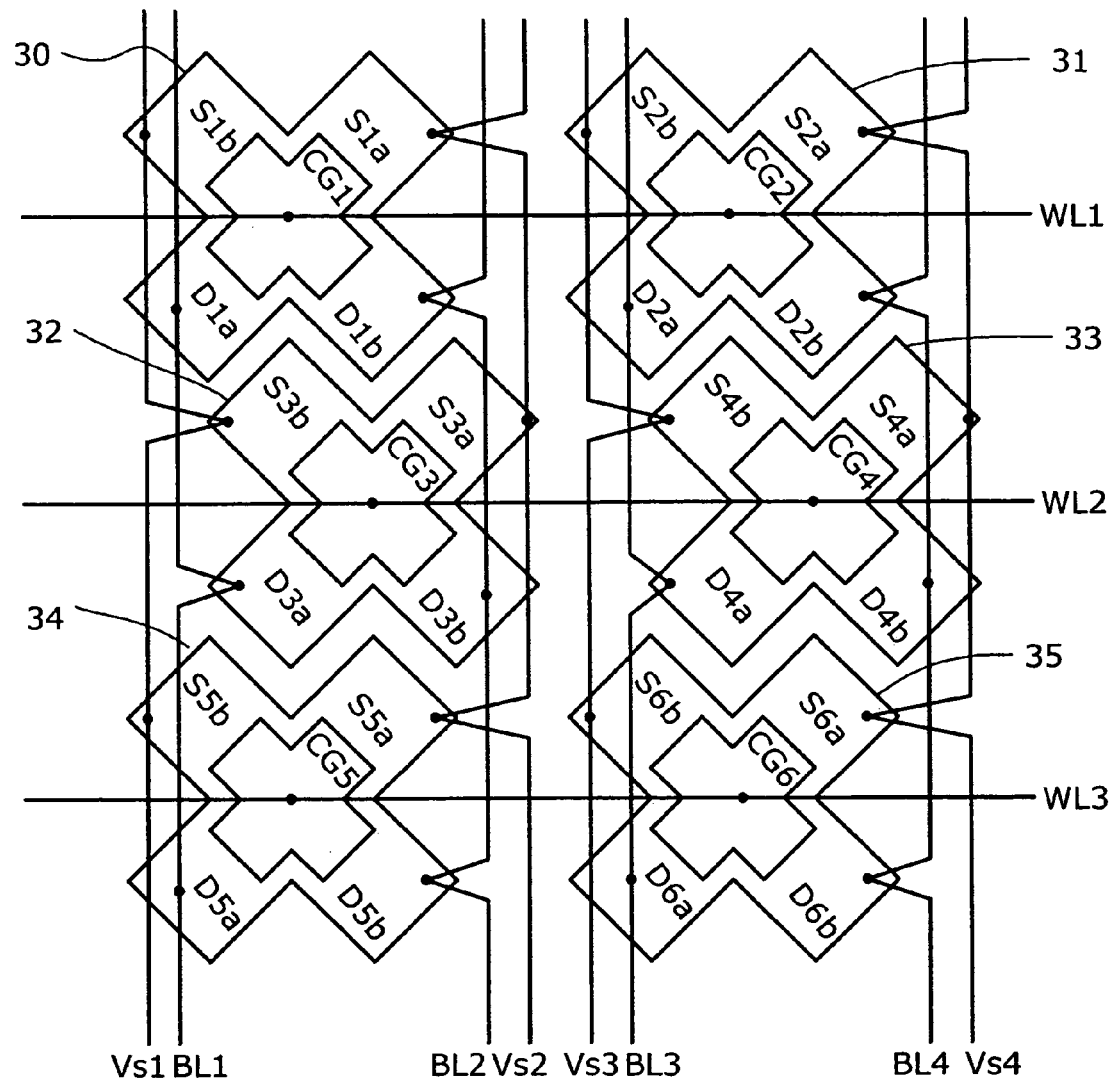
FIG. 11 shows a layout of cross-shaped memory cells on a chip.
Figure 12:
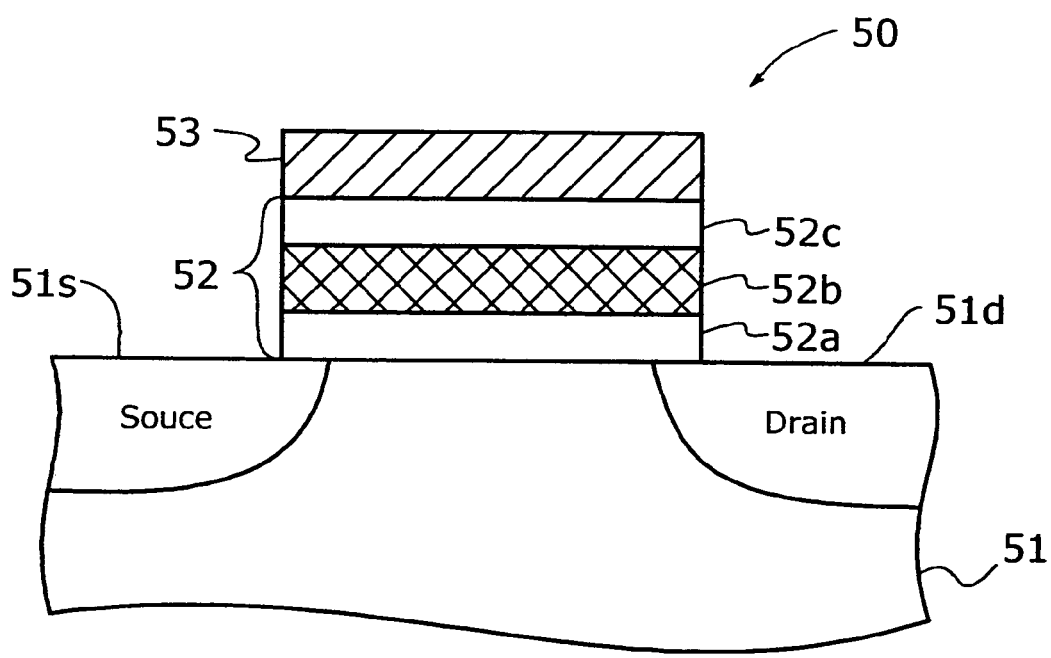
FIG. 12 shows a simplified cross-sectional view of a MONOS cell, as an example of an existing non-volatile semiconductor memory device.

Referring next to FIGS. 10 and 11, a third embodiment of the present invention will be described below. The third embodiment relates to a chip layout using the semiconductor memory cells that have been described as the first and second embodiments.

FIG. 10 is a plan view of a cross-shaped memory cell. The illustrated memory cell has a single common gate electrode CG associated with the following two source-drain pairs: source electrode Sa and drain electrode Da, and source electrode Sb and drain electrode Db. This arrangement is actually a combination of two instances of the multibit semiconductor memory cell 1 (FIG. 5) or 20 (FIG. 9), the center lines of which cross each other at right angles, with the shared gate electrode located at their intersection. Since each element stores two bits, the cross-shaped structure provides four-bit-per-cell storage. While the illustrated two source-drain pairs are arranged at right angles to each other, the invention is not limited to this specific shape. Other arrangements can also serve the purpose as long as the two elements share a single gate electrode CG.

The proposed memory device contains a two-dimensional array of cross-shaped memory cells described above. FIG. 11 shows a chip layout where a plurality of cross-shaped memory cells 30 to 35 are neatly aligned in rows and columns, each rotated by 45 degrees. The wiring layers of this device provides source lines Vs1 to Vs4 and drain lines BL1 to BL4 running in the column direction, and gate lines WL1 the WL3 running in the row direction.

The cells 30, 32, and 34 on the left-hand side of FIG. 11 have two sets of source electrodes and drain electrodes. Their first source electrodes S1b, S3b, and S5b are wired to the first source line Vs1. Their second source electrodes S1a, S3a, and S5a are wired to the second source line Vs2. Their first drain electrodes D1a, D3a, and D5a are wired to the first drain line BL1. Their second drain electrodes D1b, D3b, and D5b are wired to the second drain line BL2. Likewise, the cells 31, 33, and 35 on the right-hand side of FIG. 11 have two sets of source electrodes and drain electrodes. Their first source electrodes S2b, S4b, and S6b are wired to the third source line Vs3. Their second source electrodes S2a, S4a, and S6a are wired to the fourth source line Vs4. Their first drain electrodes D2a, D4a, and D6a are wired to the third drain line BL3. Their second drain electrodes D2b, D4b, and D6b are wired to the fourth drain line BL4. The first gate line WL1 drives the gate electrodes CG1 and CG2 of the cells 30 and 31. The second gate line WL2 drives the gate electrode CG3 and CG4 of the cells 32 and 33. The third gate line WL3 drives the gate electrode CG5 and CG6 of the cells 34 and 35.

The write operation to a cell is performed as follows. Take the top-left cell 30, for example. When the first gate line WL1 is driven to a high level, the cell 30 and its neighboring cell 31 become ready for programming at the same time since WL1 is connected to both cells. The four charge-trapping sites of the cell 30 can now be programmed individually by driving four lines Vs1, BL1, Vs2, and BL2. Gate lines WL1 to WL3 run in the row direction, while the other lines Vs1 to V4 and BL1 to BL4 in the column direction. This matrix wiring permits selective programming of a desired cell, without interfering surrounding cells. One of those lines Vs1 to V4 and BL1 to BL4 may, however, be shared by immediately adjacent cells.

The above discussion is now summarized as follows. According to the present invention, the gate insulating film of a semiconductor memory device is designed to have a phase-separated, uneven composition of high-dielectric materials, so as to create charge-trapping regions with intended storage characteristics, rather than using traps accidentally produced in the high-dielectric film. Each charge-trapping region offers a dot-like local potential minimum because of the bandgap difference between two kinds of oxides. By choosing appropriate substances, desired trap properties (e.g., trap depth, capture cross-section, capture rate, emission rate) can be obtained, which enables each memory cell to hold the trapped electrons in a more stable and durable way. This feature contributes to the improvement of data retention of multi-bit high-density memory devices.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a non-volatile semiconductor memory device which uses a high-dielectric material for gate insulation, the method comprising the steps of:
   forming a gate insulating film by depositing a mixture of a first oxide and a second oxide, the second oxide having a smaller bandgap than that of the first oxide; and
   applying a heat treatment to the gate insulating film to produce a phase separated state of the first and second oxides deposited.

2. The method according to claim 1, wherein at least one of the first and second oxides is expressed by a chemical formula of $MO_2$ where M represents an element selected from the group consisting of silicon, titanium, hafnium, and zirconium.

3. The method according to claim 1, wherein:
the first oxide is expressed by a chemical formula of $MO_2$ where M represents an element selected from the group consisting of silicon, titanium, hafnium, and zirconium; and
the second oxide is expressed by a chemical formula of $M'_2O_3$ where M' represents an element selected from the group consisting of aluminum, yttrium, lanthanum, praseodymium, gadolinium, and dysprosium.

4. The method according to claim 1, wherein the first oxide is expressed by a chemical formula of $M'_2O_3$ where M' represents an element selected from the group consisting of aluminum, yttrium, lanthanum, praseodymium, gadolinium, and dysprosium; and
the second oxide is expressed by a chemical formula of $MO_2$ where M represents an element selected from the group consisting of silicon, titanium, hafnium, and zirconium.

5. The method according to claim 1, further comprising the step of injecting electrons into a local potential minimum that is produced due to the bandgap difference between the phase-separated first and second oxides, using either of substrate injection, channel hot electron injection, Fowler-Nordheim tunneling, and direct tunneling techniques.

6. The method according to claim 1, further comprising the step of forming a silicon oxynitride film as an underlying layer of the gate insulating film.

7. The method according to claim 1, further comprising the steps of:
causing oxynitridation of the top surface of the gate insulating film; and
forming a gate electrode on the oxynitrided top surface of the gate insulating film.

* * * * *